United States Patent
Uemura et al.

(10) Patent No.: US 9,824,858 B2
(45) Date of Patent: Nov. 21, 2017

(54) COVERING MATERIAL STRIPPING METHOD AND STRIPPING DEVICE USING ION IRRADIATION

(71) Applicant: SHINMAYWA INDUSTRIES, LTD., Takarazuka-shi, Hyogo (JP)

(72) Inventors: Kensuke Uemura, Takarazuka (JP); G. Alexey Remnev, Takarazuka (JP)

(73) Assignee: SHINMAYWA INDUSTRIES, LTD., Takarazuka (JP)

( * ) Notice: Subject to any disclaimer, the term of this patent is extended or adjusted under 35 U.S.C. 154(b) by 0 days.

(21) Appl. No.: 15/324,553

(22) PCT Filed: Mar. 29, 2016

(86) PCT No.: PCT/JP2016/060257
§ 371 (c)(1),
(2) Date: Jan. 6, 2017

(87) PCT Pub. No.: WO2016/163278
PCT Pub. Date: Oct. 13, 2016

(65) Prior Publication Data
US 2017/0207065 A1    Jul. 20, 2017

(30) Foreign Application Priority Data

Apr. 8, 2015    (JP) .................................. 2015-078851

(51) Int. Cl.
*H01J 37/305*    (2006.01)
*H01J 37/08*    (2006.01)

(52) U.S. Cl.
CPC .......... *H01J 37/3053* (2013.01); *H01J 37/08* (2013.01); *H01J 2237/006* (2013.01); *H01J 2237/0825* (2013.01); *H01J 2237/20214* (2013.01)

(58) Field of Classification Search
None
See application file for complete search history.

(56) References Cited

U.S. PATENT DOCUMENTS 5,235,236 A * 8/1993 Nakahata ................. H03H 3/08
310/313 A
5,391,510 A * 2/1995 Hsu .................... H01L 21/28079
257/E21.202
(Continued)

FOREIGN PATENT DOCUMENTS

CA     2 846 434 A1    12/2013
JP     H04-41670 A     2/1992
(Continued)

OTHER PUBLICATIONS

Jun. 14, 2017 European Search Report issued in European Application No. 16776446.3.
(Continued)

*Primary Examiner* — Allan Olsen
(74) *Attorney, Agent, or Firm* — Oliff PLC

(57) ABSTRACT

A de-coating method includes: exposing a coated body in which a coating made of an inorganic material is formed on a surface of the metal body to ion flows to peel off the coating from the metal body, wherein the coated body is placed at an ion flow-concentrated portion where two or more ion flows overlap each other, and is exposed to the ion flows without addition of a positive or negative bias to the coated body. As gases for use in generating ions from plasma, oxygen and $CF_4$ that promote de-coating through a chemical reaction are preferably used in addition to Ar that performs de-coating under the physical action of ion collision and stabilizes plasma.

4 Claims, 18 Drawing Sheets

(56) References Cited

U.S. PATENT DOCUMENTS

| | | | | |
|---|---|---|---|---|
| 6,013,191 | A | * | 1/2000 | Nasser-Faili ............ C30B 33/00 204/192.34 |
| 6,475,573 | B1 | * | 11/2002 | Veerasamy ............ B05D 5/083 427/249.7 |
| 2001/0028919 | A1 | | 10/2001 | Liu et al. |
| 2003/0099835 | A1 | * | 5/2003 | Petrmichl ............... C03C 17/22 428/408 |
| 2006/0076509 | A1 | | 4/2006 | Okino et al. |
| 2009/0256081 | A1 | | 10/2009 | Kaga |
| 2011/0147200 | A1 | | 6/2011 | Hirayanagi et al. |
| 2012/0098896 | A1 | * | 4/2012 | Nihei .................... B41J 2/1606 347/68 |

FOREIGN PATENT DOCUMENTS

| | | |
|---|---|---|
| JP | H06-168437 A | 6/1994 |
| JP | 2006-100668 A | 4/2006 |
| JP | 2009-272293 A | 11/2009 |
| JP | 2011-146690 A | 7/2011 |
| JP | 2011-178616 A | 9/2011 |
| WO | 2007/116522 A1 | 10/2007 |

OTHER PUBLICATIONS

Jun. 7, 2016 Written Opinion issued in International Patent Application No. PCT/JP2016/060257.
Catalog "14. 10 K-0501," ShinMaywa Industries, Ltd., Industrial Machinery Systems Division, PB Project, Oct. 2014.
Kensuke Uemura, Development and Investigation of Beam and Plasma Methods for Improving the Performance Properties of the Products Made of Metal Materials, Tomsk Polytechnic University, 2011, pp. 77-83.
Ion Engineering Handbook, supervised by Hiroyuki Mizuno, Ion Engineering Research Institute Corporation, Oct. 30, 2004, p. 55.
Jun. 7, 2016 International Search Report issued in International Patent Application No. PCT/JP2016/060257.
Aug. 15, 2017 Office Action issued in Japanese Patent Application No. 2017-510945.

* cited by examiner point1: φ=(4.29° - 68.50°)
point2: φ=(27.94° - 126.04°)

$$J = J_0 \sin(\varphi)$$

$$J_{total1} = \int_{\varphi_1}^{\varphi_2} J_0 \sin(\varphi)d\varphi = \int_{4.29°}^{68.50°} J_0 \sin(\varphi)d\varphi = 0.6306 J_0$$

$$J_{total2} = \int_{\varphi_1}^{\varphi_2} J_0 \sin(\varphi)d\varphi = \int_{27.94}^{126.04°} J_0 \sin(\varphi)d\varphi = 1.4718 J_0$$

$J_0$ : ION CURRENT DENSITY $(mA/cm^2)$ (a)

(b)

PEELED-OFF PCD IS PARTIALLY VAPOR-DEPOSITED AGAIN

COVERING MATERIAL STRIPPING METHOD AND STRIPPING DEVICE USING ION IRRADIATION

TECHNICAL FIELD

The present invention relates to a de-coating method and a de-coating apparatus for coated bodies with ion irradiation.

BACKGROUND ART

It is an urgent issue to establish a technique for enabling recycling of tools and mechanical parts coated with inorganic materials such as poly-crystalline diamond (which may be hereinafter abbreviated as "PCD") through the de-coating.

This is now described by taking tools such as a drill and an end mill which are each formed of tool steel or cemented carbide as examples. Each of the tools uses tool steel or cemented carbide coated with TiN, TiAlN, DLC, or PCD.

With the use of the tools, these coatings wear out or peel off to cause the tools to reach the end of their service life. Such used tools have conventionally been discarded but recycling through the de-coating and further repetition of coating has been desired. It has been required to perform efficient and uniform de-coating and not to cause damage to substrates.

Methods of plasma or ion irradiation in a vacuum have already been put into practical use as proposals for such a de-coating method (see, for example, Non-Patent Literatures 1 and 2).

However, the former plasma irradiation method is low in de-coating efficiency because plasma forms, on the front surface of a substrate, a space electrical layer called a sheath where no ion collision occurs, thus forming a barrier that may hinder a de-coating action (see Non-Patent Literature 3).

Further, the latter ion irradiation method may lead to insufficient de-coating or cause thin film residue through re-evaporation on the remaining coating as a result of sputtering of a substrate.

In addition, there is also a case where a tool having a thin film of TiAlN or the like is subjected to de-coating using a chemical agent heated to a high temperature but this case has a problem in terms of use of an environmentally unfriendly chemical agent.

CITATION LIST

Non-Patent Literature

Non-Patent Literature 1: Catalog "'14. 10 K-0501," Shin-Maywa Industries, Ltd., Industrial Machinery Systems Division, PB Project, October, 2014
Non-Patent Literature 2: KENSUKE UEMURA, "DEVELOPMENT AND INVESTIGATION OF BEAM AND PLASMA METHODS FOR IMPROVING THE PERFORMANCE PROPERTIES OF THE PRODUCTS MADE OF METAL MATERIALS," Tomsk Polytechnic University, 2011, pp. 77-83
Non-Patent Literature 3: Ion Engineering Handbook, supervised by Hiroyuki Mizuno, Ion Engineering Research Institute Corporation, Oct. 30, 2004, p. 55

SUMMARY OF INVENTION

Technical Problems

The inventors of the present application have made intensive studies and found that when unevenness in ion irradiation occurs in the latter ion irradiation method to give rise to a region insufficiently exposed to ion irradiation (hereinafter referred to also as "dead area"), thin film residue will occur.

It has also been found that when a tool made of cemented carbide is subjected to de-coating in a high temperature atmosphere, for example, when de-coating is performed through heating using a difference in thermal expansion between a substrate and a PCD coating, or when de-coating is performed through high temperature baking using microwave plasma, a brittle phase which is typically η phase (e.g., $W_3Co_3C$ or $W_2Co_4C$) may be formed in the case of cemented carbide.

In order to thus perform de-coating to enable recycling of a tool or a mechanical part coated with an inorganic material such as PCD, it is essential to prevent a substrate to be subjected to de-coating from having a dead area during ion irradiation, to perform a treatment at an ambient temperature at which no brittle phase is formed in the substrate (metal body), and to cause de-coating to be performed at an economical speed.

The present invention has been made to solve the problems as described above. Specifically, the present invention provides a de-coating method and a de-coating apparatus that are capable of recycling a tool or a mechanical part coated with an inorganic material such as PCD and with which a substrate to be subjected to de-coating (coated body) is less likely to have a dead area during ion irradiation, a treatment can be performed at an ambient temperature at which no brittle phase is formed in the substrate (metal body), and de-coating can be performed at an economical speed.

Solution to Problems

The inventors of the present application have made intensive studies and found that when a bias voltage is added to the substrate in the above-mentioned ion irradiation method, the ion flow is changed to cause unevenness in ion irradiation to give rise to a region insufficiently exposed to the ion irradiation (hereinafter referred to also as "dead area"), thus causing thin film residue.

It has been found that when a body to be subjected to de-coating (coated body) is placed, for example, at a central portion in a vacuum chamber of an ion irradiation apparatus and two or more ion sputtering guns are used to make ion flows from the peripheral portions overlap each other at the central portion, the cross-sectional diameter of each ion flow is equal to or smaller than the diameter of the ion sputtering gun and hence is small, but concentrated ion irradiation is made possible at the central portion of the vacuum chamber where the body to be subjected to de-coating (coated body) is placed, and when the body to be subjected to de-coating (coated body) is grounded, for example, when forced bias addition is not performed (bias voltage $U_{bias}=\pm0$ V), the ion flows are not deflected and a dead area is less likely to occur. In addition, it has been found that ion irradiation can be performed at a relatively low temperature, and hence a brittle phase which is typically η phase does not occur in the case of cemented carbide.

Specifically, the inventors of the present application placed a body to be subjected to de-coating (coated body) on the ground (and preferably further performed ion irradiation without adding forced bias) to protect the ion flows from deflection under the influence of the bias, thereby reducing occurrence of dead areas. Further, ion irradiation was performed at a low temperature (e.g., about 200° C. or less) to prevent occurrence of a brittle phase. Under further preferred conditions, an increase in the surface roughness of the substrate could be suppressed so that the surface roughness could fall within a range in which a regenerated film can be formed more easily. Then, a coating layer formed to a thickness of about 10 μm could be removed in a short period of time (e.g., about 6 hours), and the economical speed could be also maintained.

The inventors have made intensive studies to solve the above-mentioned problems and completed the invention as described below.

The present invention provides the following (1) to (7).
(1) A de-coating method comprising: exposing a coated body in which a coating made of an inorganic material is formed on a surface of a metal body to ion flows to peel off the coating from the metal body,
wherein the coated body is placed at an ion flow-concentrated portion where two or more ion flows overlap each other, is grounded, and is exposed to the ion flows.
(2) The de-coating method according to (1), comprising:
a first step which includes turning a gas [1] containing at least 67 vol % of oxygen into plasma to generate ions of the gas and exposing the coated body to the resulting ion flows to perform de-coating, and
a second step which includes turning a gas [2] containing at least 80 vol % of argon into plasma to generate ions of the gas and exposing the coated body to the resulting ion flows to perform de-coating,
wherein the first step is followed by the second step.
(3) The de-coating method according to (2), wherein the de-coating method comprises only the first step and the second step so that de-coating of the coated body can be completed by performing the second step serving as a final step.
(4) The de-coating method according to (2) or (3), wherein the gas [1] contains at least one selected from the group consisting of argon, $CF_4$, $SF_6$, $CCl_4$, and $CCl_2F_2$.
(5) The de-coating method according to any one of (2) to (4), wherein the gas [1] contains $CF_4$, and a ratio of a $CF_4$ content (vol %) to a total of the $CF_4$ content (vol %) and an oxygen content (vol %) (($CF_4$ content/($CF_4$ content+oxygen content))×100) is 5% or less.
(6) A de-coating apparatus configured to expose a coated body in which a coating made of an inorganic material is formed on a surface of a metal body to ion flows to peel off the coating from the metal body,
wherein the coated body is configured to be grounded,
wherein the de-coating apparatus comprises two or more ion guns and the ion guns are placed to form an ion flow-concentrated portion, and
wherein the coated body is configured to be placeable at the ion flow-concentrated portion so that the de-coating method according to any one of (1) to (5) can be performed.
(7) The de-coating apparatus according to (6), including a function of rotating and/or revolving the coated body placed at the ion flow-concentrated portion with respect to the ion flows.

Advantageous Effects of Invention

According to the invention, there can be provided a de-coating method and a de-coating apparatus that are capable of recycling a tool or a mechanical part coated with an inorganic material such as PCD and with which a substrate to be subjected to de-coating (coated body) is less likely to have a dead area during ion irradiation, a treatment can be performed at an ambient temperature at which no brittle phase is formed in the substrate (metal body), and de-coating can be performed at an economical speed.

As described above, according to the invention, no forced bias is added to the body to be subjected to de-coating (coated body). Specifically, for example, a positive or negative, or square-wave or sinusoidal bias is not forcibly added to the body to be subjected to de-coating (coated body).

Further, the body to be subjected to de-coating (coated body) is to be grounded, and an exemplary method usually involves directly grounding a holding for placing the coated body or electrically connecting the holder to a chamber and grounding the chamber. Therefore, the invention does not apply a so-called floating method which involves performing a treatment in a state in which a holder is insulated from the other bodies.

DESCRIPTION OF EMBODIMENTS

The present invention is described.

The present invention provides a de-coating method comprising: exposing a coated body in which a coating made of an inorganic material is formed on a surface of a metal body to ion flows to peel off the coating from the metal body, wherein the coated body is placed at an ion flow-concentrated portion where two or more ion flows overlap each other, is grounded, and is exposed to the ion flows.

The de-coating method as described above is hereinafter referred to also as the "method of the invention."

The present invention also provides a de-coating apparatus configured to expose a coated body in which a coating made of an inorganic material is formed on a surface of a metal body to ion flows to peel off the coating from the metal body, wherein the coated body is configured to be grounded, wherein the de-coating apparatus comprises two or more ion guns and the ion guns are placed to form an ion flow-concentrated portion, and wherein the coated body is configured to be placeable at the ion flow-concentrated portion so that the method of the invention can be performed.

The de-coating apparatus as described above is hereinafter referred to also as the "apparatus of the invention."

In the following, when the wording "the invention" is only used, the invention should mean both the method of the invention and the apparatus of the invention.

According to the invention, a coated body in which a coating made of an inorganic material is formed on a surface of a metal body is exposed to ion flows to peel off the coating from the metal body.

A coated body in the invention includes a metal body serving as a base metal and a coating made of an inorganic material and formed on a surface of the metal body.

The material of the metal body is not particularly limited and examples thereof include steels and cemented carbides.

The coating is also not particularly limited as long as the coating is made of an inorganic material, and exemplary materials include TiN, TiAlN, DLC, and PCD.

Specifically, a tool or mechanical part coated with an inorganic material such as PCD corresponds to the coated body. More specifically, a tool such as a drill or an end mill formed of tool steel or cemented carbide corresponds to the coated body.

According to the invention, the coated body as described above is exposed to ion flows to peel off the coating from the metal body. A tool whose coating has reached the end of its service life or which failed in coating has conventionally been discarded. However, de-coating and further coating makes it possible to use the tool again.

Next, the apparatus of the invention is described with reference to FIG. 1. The coating can be peeled off from the metal body through exposure of the coated body as described above to ion flows using the apparatus of the invention.

Figure 1:
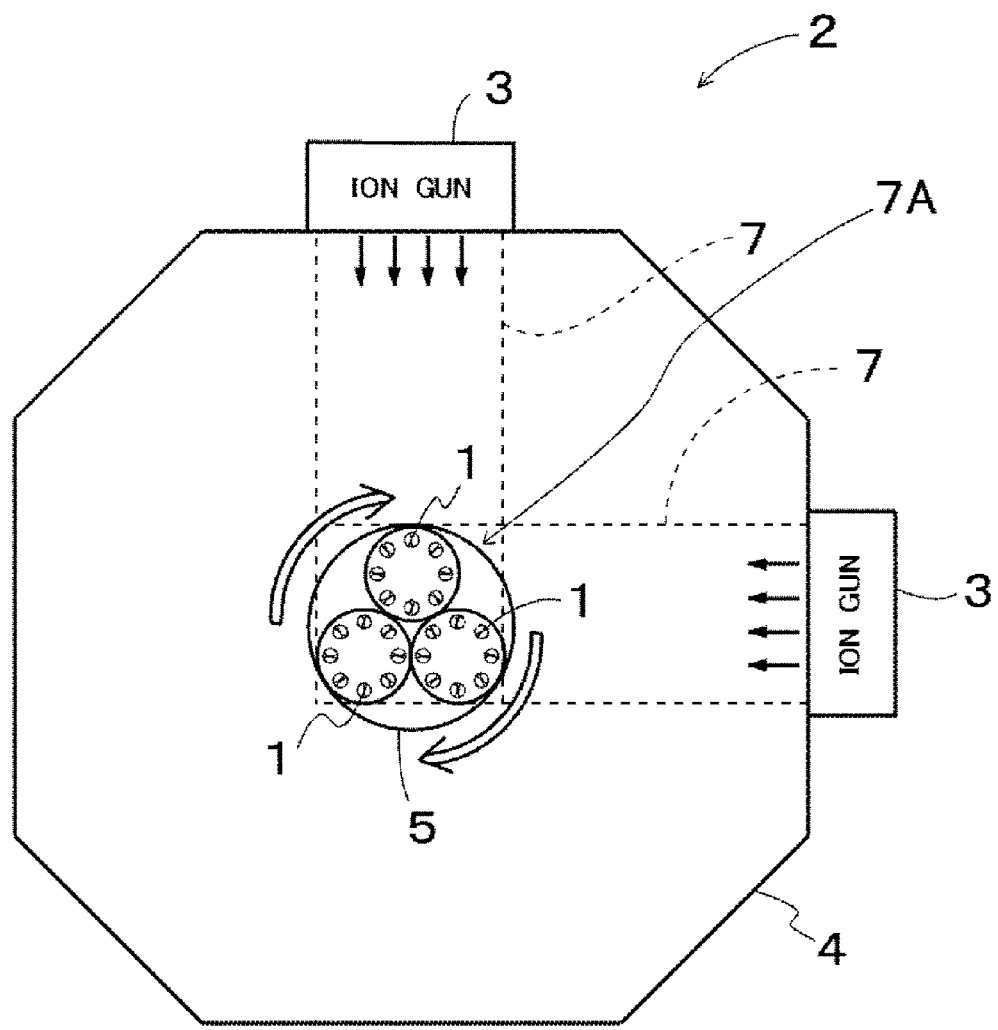
FIG. 1 is a schematic cross-sectional view illustrating a preferred embodiment of an apparatus of the invention.

FIG. 1 is a schematic cross-sectional view illustrating a preferred embodiment of the apparatus of the invention.

In FIG. 1, the apparatus 2 of the invention includes two ion guns 3 and a vacuum chamber 4, and a holder 5 is placed at a central portion in the vacuum chamber 4.

Then, respective ion flows 7 emitted from the two ion guns are placed to overlap each other at its central portion to form an ion flow-concentrated portion 7A. Coated bodies 1 can be set in the holder 5 which is placed at the central portion of the vacuum chamber 4 and where the ion flow-concentrated portion 7A is formed.

In this regard, the holder 5 is grounded, which causes the set coated bodies 1 to be grounded. The coated bodies 1 can be grounded by directly grounding the holder 5. However, the coated bodies 1 can be also grounded by electrically connecting the holder 5 to the chamber 4 and grounding the chamber 4.

The type of grounding used is grounding type 1 (10Ω or less).

Each coated body 1 placed at the ion flow-concentrated portion 7A is configured to be capable of rotating on its axis with respect to the ion flows 7 in a state in which the coated body 1 is set in the holder 5. For example, when the coated body 1 is a drill, "rotating on its axis" as used herein refers to rotating on a longitudinal axis of the drill.

Further, the holder 5 has a function of rotating (revolving) clockwise (in a direction of arrows in FIG. 1) to cause the coated bodies 1 to revolve.

Each of the ion guns 3 fixed to the vacuum chamber 4 as illustrated in FIG. 1 turns a gas introduced through a gas inlet into plasma to generate ions of the gas, and emits the ion flow 7 serving as an ion beam.

Various types of ion beam generating devices are commercially available and may be used in the apparatus of the invention without particular limitation. For example, a CED ion gun (Closed Electron Drift Ion Gun) can be used.

In this regard, any gas may be introduced through the gas inlets as long as gas ions that can remove a surface coating of the coated body 1 are generated. For example, in terms of inert chemical species and a high de-coating effect, rare gases and particularly inert elements such as argon, xenon, and krypton which have a larger atomic weight than neon are preferred, and argon is more preferably used.

The gas preferably also includes an oxygen-containing gas. Air is an example of the oxygen-containing gas.

When the apparatus of the invention as illustrated in FIG. 1 is used to subject the coated body to de-coating according to the method of the invention, it is preferred to perform a first step which involves turning a gas [1] containing at least 67 vol % of oxygen into plasma to generate ions of the gas and exposing the coated body to the resulting ion flows to perform de-coating, and thereafter a second step which involves turning a gas [2] containing at least 80 vol % of argon into plasma to generate ions of the gas and exposing the coated body to the resulting ion flows to perform de-coating.

Further, the method of the invention preferably includes only the first step and the second step so that de-coating of the coated body can be completed by performing the second step serving as the final step.

Reasons why the method of the invention including the first step and the second step as described above (preferably including only the first step and the second step) is preferred are described below.

Gases such as oxygen usually serve to perform oxidative de-coating in addition to a physical collision reaction of ions and hence are higher in de-coating rate than rare gases. However, the gases may cause oxidation, that is, embrittlement of the substrate in the final step of the de-coating. In case of embrittlement, it would be difficult to form a regenerated film. Therefore, it is preferred to use a gaseous species such as oxygen that may cause a chemical reaction until a certain de-coating step, and to use a rare gas (for example, argon) to prevent embrittlement of the substrate when de-coating approaches its end. In a case where a gas species such as oxygen that may cause a chemical reaction is used to perform de-coating, a rare gas (for example, argon) is preferably used to prevent embrittlement of the substrate when a remaining thin film has a minimum thickness value of 1 μm (in other words, when a remaining thin film has a thickness of 1 μm at its thinnest portion). Changing the gas species in this way makes it possible to improve the de-coating rate while preventing embrittlement of the substrate.

In the first step, as described above, the gas [1] containing at least 67 vol % of oxygen is used. However, the oxygen concentration in the gas [1] is preferably at least 80 vol %, more preferably at least 90 vol %, and even more preferably at least 95 vol %, and may be 100 vol %.

At least one selected from the group consisting of argon, $CF_4$, $SF_6$, $CCl_4$, and $CCl_2F_2$ may be contained in the gas [1] as a gas other than oxygen. Among those, at least one selected from the group consisting of argon and $CF_4$ is preferred, and $CF_4$ is more preferred.

The gas [1] preferably contains argon because stable plasma is more likely to occur.

The argon content in the gas [1] is preferably 20 vol % or less, more preferably 10 vol % or less, even more preferably 5 vol % or less, still more preferably 3 vol % or less, and still even more preferably 1 vol % or less.

The inventors of the present application have found that, when the gas [1] only contains oxygen, depending on the tool type, the substrate may be sputtered by oxygen ions to form a thin film made of the same material as the substrate on a still remaining coating. As a result of further research and development, it has been found that such a phenomenon is less likely to occur when the gas [1] contains $CF_4$.

The $CF_4$ content in the gas [1] is preferably 33 vol % or less, more preferably 20 vol % or less, even more preferably 10 vol % or less, still more preferably 5 vol % or less, still even more preferably 3 vol % or less, and even still more preferably 1 vol % or less.

In the second step, as described above, the gas [2] containing at least 80 vol % of argon is used. However, the argon concentration in the gas [2] is preferably at least 90 vol %, more preferably at least 95 vol %, and even more preferably 100 vol %.

When the first step and the second step are performed in succession, the gas species being introduced through the gas inlets is changed from the gas [1] to the gas [2]. The gas [1] and the gas [2] are mixed together for a short period of time (for example a few minutes) from just after the change but that does not adversely affect the de-coating action. Such a case is also deemed to correspond to a process in which the first step and the second step are only performed. In other words, the case is deemed to correspond to the method of the invention including only the first step and the second step.

The gas with which the vacuum chamber 4 is filled preferably has a vacuum pressure of 0.01 to 1.0 Pa, and more preferably 0.05 to 0.5 Pa.

Ion irradiation conditions (de-coating treatment conditions) vary with the gas species and the apparatus type. However, the ionization voltage is preferably 2 to 4 kV and the treatment time is preferably about 5 minutes to 6 hours. When a CED ion gun is used, the ionization current is preferably about 0.1 to 1 A.

Further, ion irradiation is preferably performed at a temperature of about 200° C. or less.

The coated body 1 is grounded and more preferably a forced bias is not added. In this case, the ion flow does not undergo deflection under the influence of bias and hence occurrence of dead areas could be successfully reduced.

Figure 2:
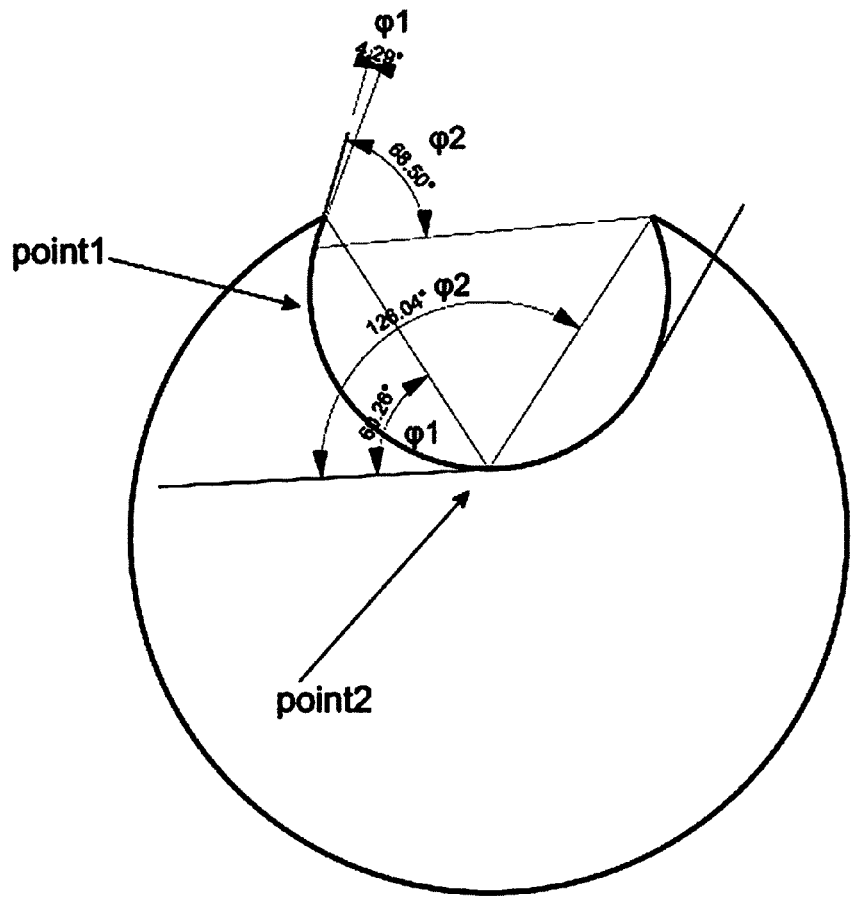
FIG. 2 illustrates simulation results on an ion flow direction and a dead area caused on a cutting face.

As described above, the apparatus of the invention has the two ion guns and a reason therefor is now described. In FIG. 2, whether or not emitted ions collide with the whole surface of the coated body is simulated when the number of ion guns is one and two.

A specific description is given below.

In FIG. 2, a cross-section of a commercially available double blade drill used in Experimental Examples 1 to 7 to be described later is simulated, and the degree of collision of ions to which a surface in a recess of the drill is exposed is calculated by line integral. $J_0$ means an ion current density ($mA/cm^2$).

As illustrated in FIG. 2, a case of one ion gun indicates a line integral value of 0.6306 $J_0$, whereas a case of two ion guns indicates a large line integral value of 1.4718 $J_0$.

From this, it is presumed that in the case of one ion gun, an area or a dead area insufficiently exposed to emitted ions may be formed, and as a result, coating residue may be found after ion irradiation.

Therefore, the apparatus of the invention preferably includes two or more ion guns.

The method of the invention can be preferably performed using the apparatus of the invention as described above.

As a result of treatment of the coated body according to the invention, a brittle phase does not occur, the surface roughness is kept at a roughness level at which re-coating is possible, a coating layer formed to a thickness of about 10 μm can be removed in a short period of time (e.g., about 6 hours), and the economical speed can be also maintained.

EXAMPLES

The present invention is described below more specifically by way of seven experimental examples.

Experimental Example 1

Figure 3:
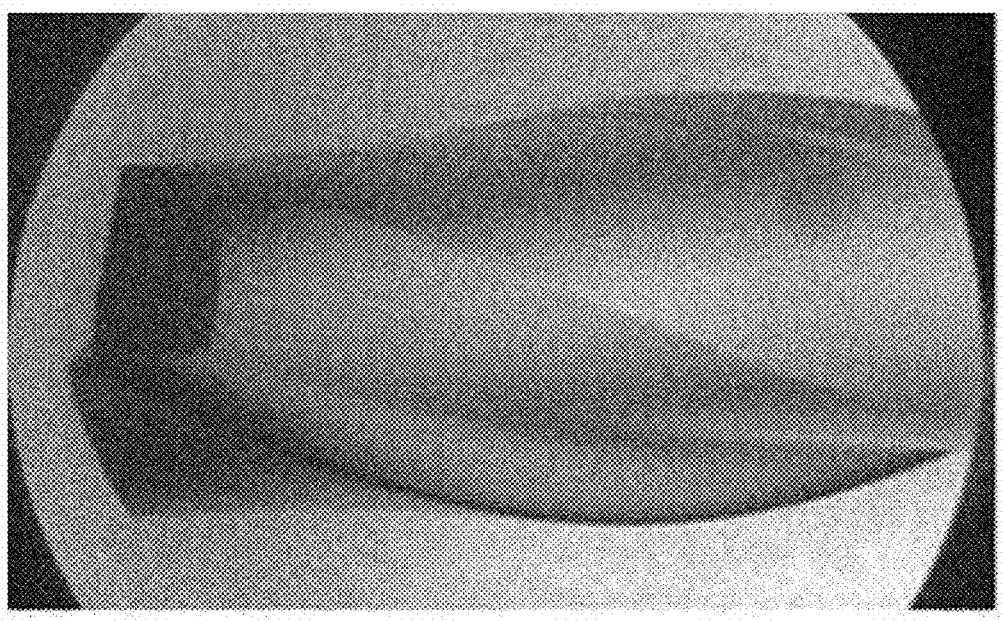
FIG. 3 is an enlarged photo of a double blade drill used in Experimental Examples 1 to 7.

Commercially available double blade drills were subjected to de-coating using a commercially available inductively coupled plasma (ICP) apparatus. Each double blade drill is made of cemented carbide coated with PCD to a thickness of 10 μm and has a nominal diameter of 10 mm. An example of the double blade drill is illustrated in a photo of FIG. 3.

Figure 4:
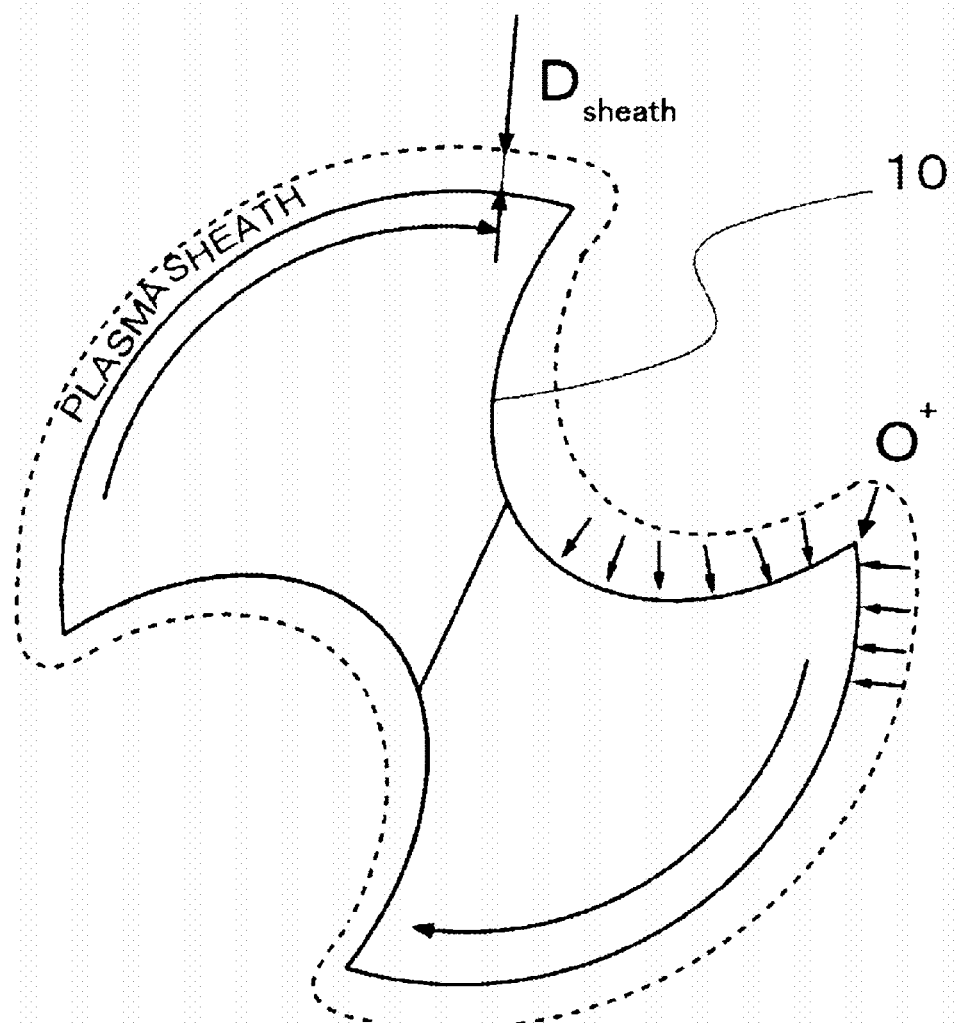
FIG. 4 is a cross-sectional view (schematic view) of a preferred example of a PCD-coated double blade drill through inductively coupled plasma (which may also be hereinafter abbreviated as "ICP").
Figure 5:
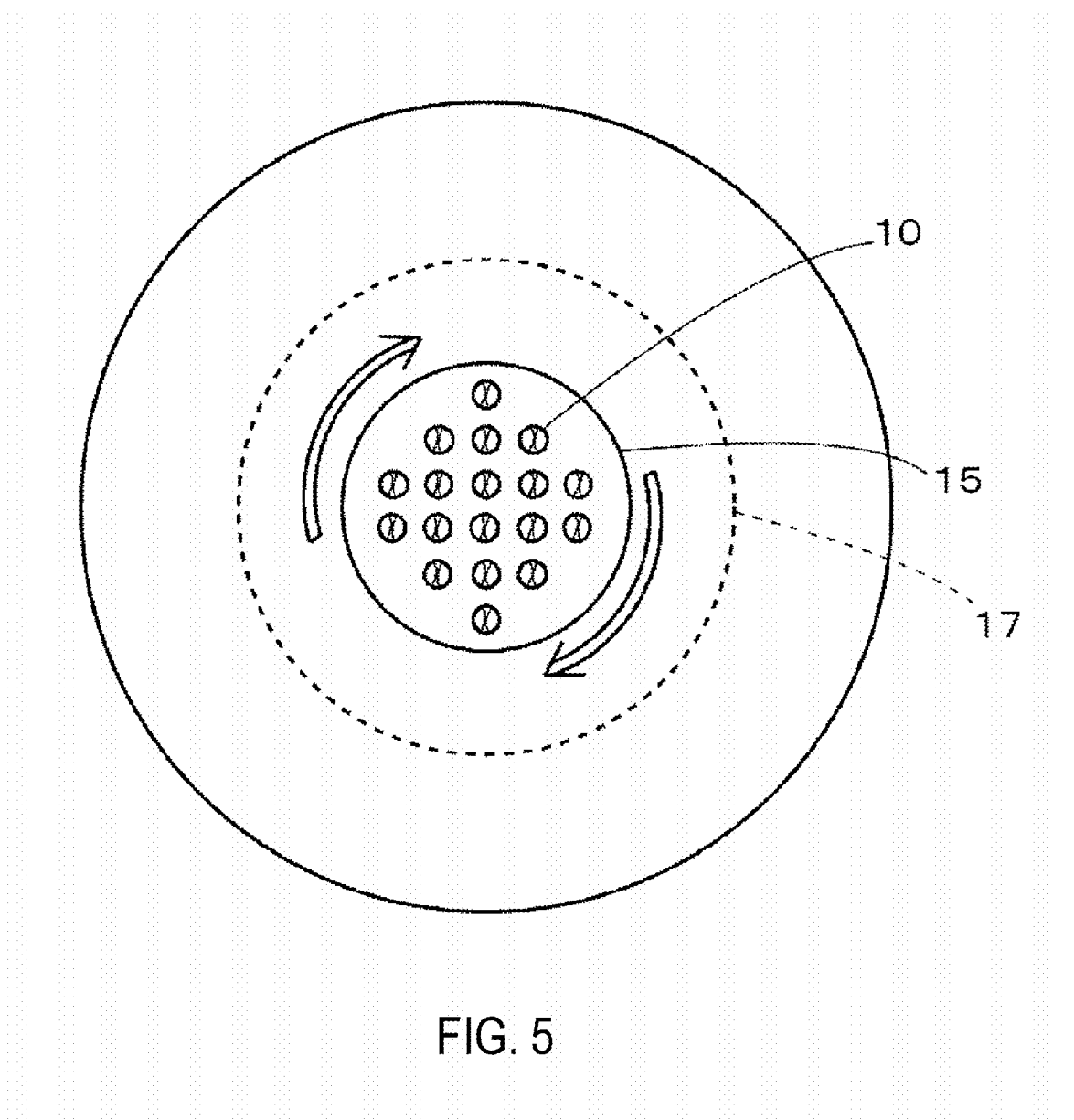
FIG. 5 is a cross-sectional view of an ICP apparatus when viewed from above and a schematic view illustrating the layout of tools.

A cross-sectional view (schematic view) of a double blade drill 10 during ICP de-coating treatment (plasma treatment) is illustrated in FIG. 4. Further, a cross-section of an ICP apparatus when viewed from above and the layout of the double blade drills 10 are illustrated in FIG. 5.

De-coating treatment conditions are shown in Table 1.

TABLE 1

| Vacuum pressure and remaining gas | P = 0.5 Pa, $O_2$ |
|---|---|
| Plasma density $n_g$/cc | $10^{12}$ |

TABLE 1-continued

| | |
|---|---|
| Bias voltage $U_{bias}$ V | −30 |
| Sheath phase thickness $D_{sheath}$ mm | 0.1 |

During the de-coating treatment, the double blade drills 10 were rotated clockwise (in a direction of arrows in FIG. 4). Further, during the de-coating treatment, as illustrated in FIG. 5, a holder 15 including the plurality of double blade drills 10 set therein was rotated clockwise (in a direction of arrows in FIG. 5) to revolve the double blade drills 10.

In FIG. 5, a region 17 inside a dotted line represents an ICP-accumulated portion.

Each double blade drill 10 was thus subjected to de-coating and as a result, a sheath with a thickness of 0.1 mm was formed through plasma on a surface of the double blade drill 10, as illustrated in FIG. 4.

Then, after the de-coating treatment, the surface of each double blade drill 10 was observed with a scanning electron microscope (SEM). An SEM image observed at 1,500× is illustrated in FIG. 6(a) and an SEM image observed at 15,000× is illustrated in FIG. 6(b).

Figure 6:
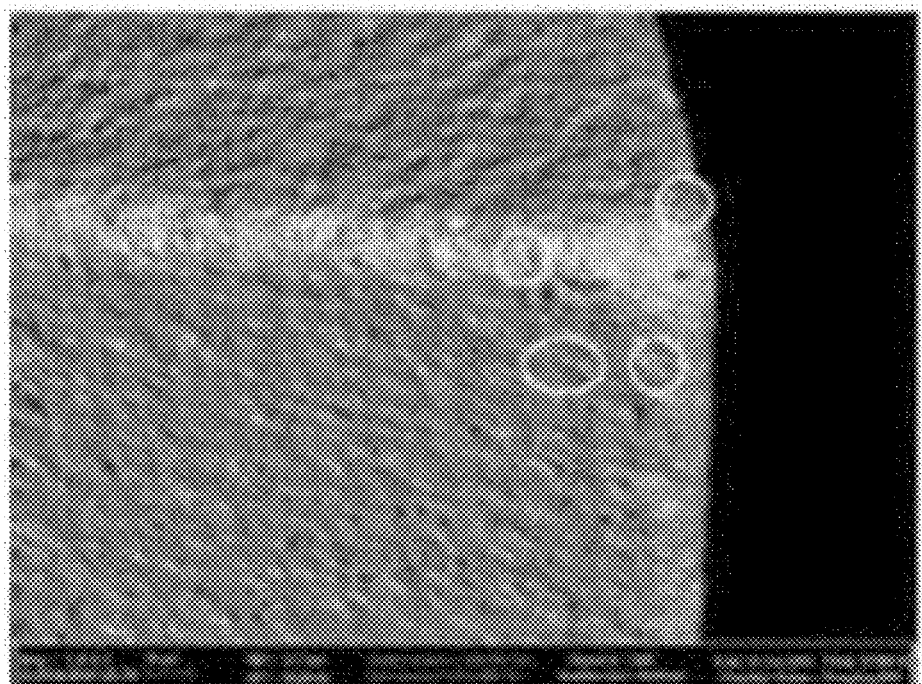
FIG. 6 are scanning electron micrographs (SEMs) after removal of a PCD coating.
Figure 6:
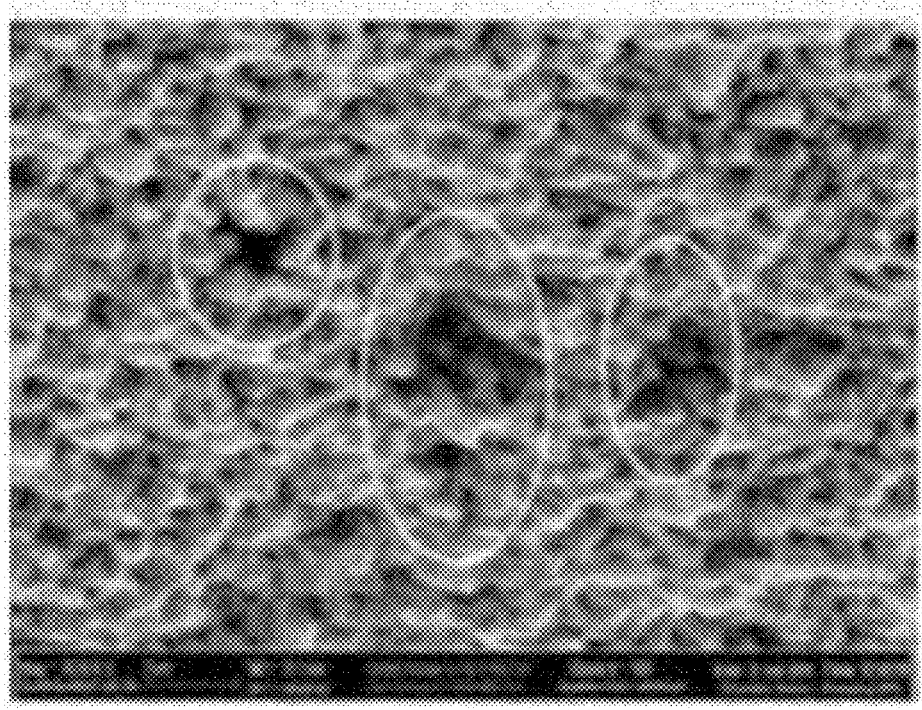

A PCD coating with a thickness of 10 μm could be removed but, as illustrated in FIG. 6(b), the substrate was roughened and a carbon film (circled portions) was formed. Therefore, it is difficult to form a coating again.

Experimental Example 2

A commercially available HC plasma apparatus (HC plasma apparatus IE-400 manufactured by ShinMaywa Industries, Ltd.) was used to subject each double blade drill 10 to de-coating as in Experimental Example 1.

Figure 7:
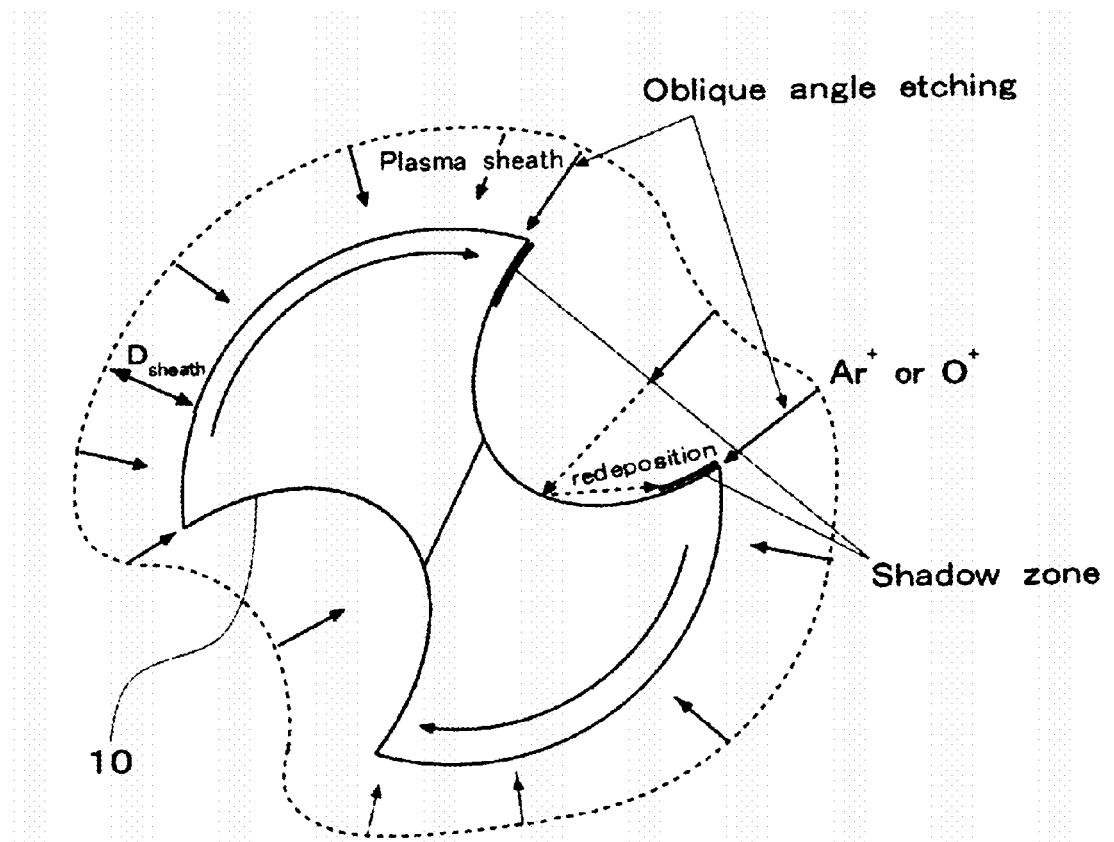
FIG. 7 is a cross-sectional view (schematic view) of a preferred example of the PCD-coated double blade drill using a hollow cathode plasma apparatus (hereinafter referred to also as "HC apparatus").
Figure 8:
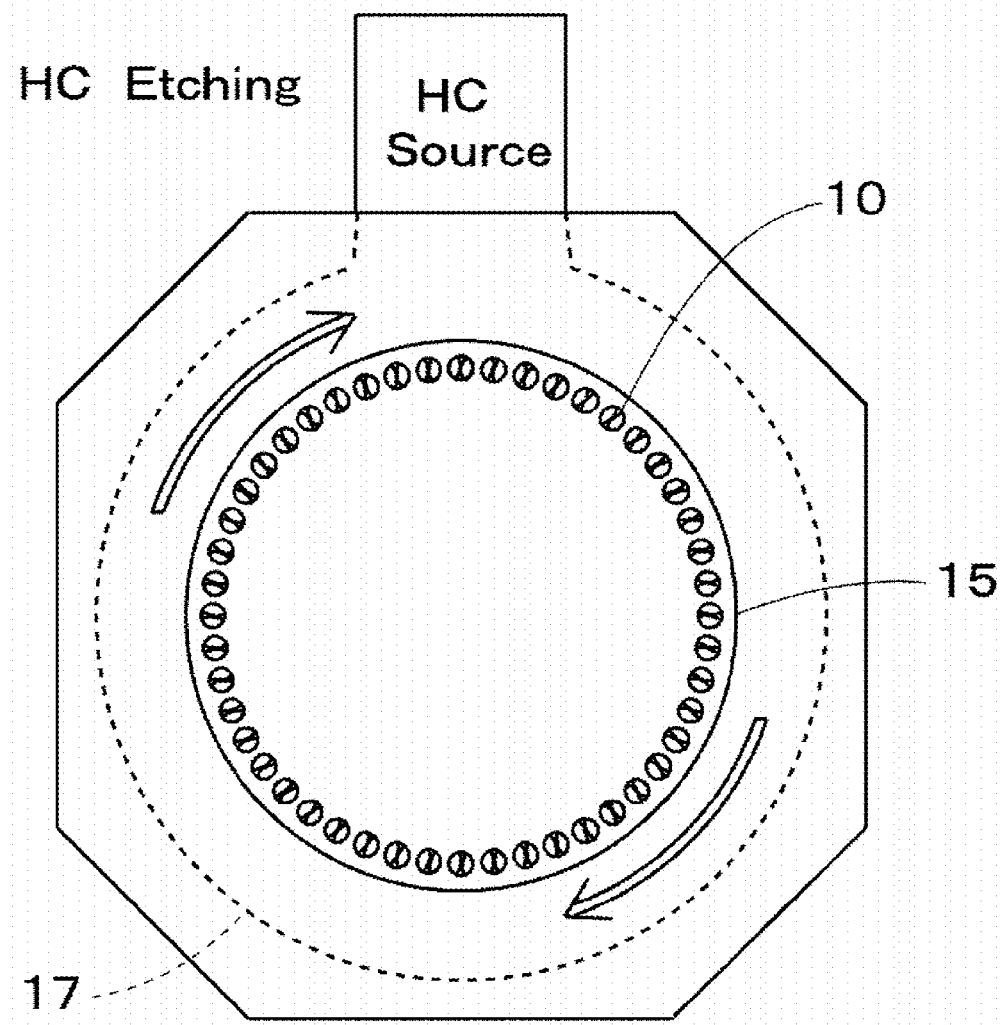
FIG. 8 is a cross-sectional view of the HC apparatus when viewed from above and a schematic view illustrating the layout of tools.

A cross-sectional view (schematic view) of the double blade drill 10 during de-coating treatment (plasma treatment) using the HC plasma apparatus is illustrated in FIG. 7. Further, a cross-section of the HC plasma apparatus when viewed from above and the layout of the double blade drills 10 are illustrated in FIG. 8.

De-coating treatment conditions are shown in Table 2.

TABLE 2

| | |
|---|---|
| Vacuum pressure and remaining gas | P = 0.4 to 1 Pa, $O_2$, Ar |
| Plasma density $n_e$/cc | $10^{10}$ |
| Bias voltage $U_{bias}$ V | −400 to −700 |
| Sheath phase thickness $D_{sheath}$ mm | 5 to 30 |

During the de-coating treatment, the double blade drills 10 were rotated clockwise (in a direction of arrows in FIG. 7). Further, during the de-coating treatment, as illustrated in FIG. 8, the holder 15 including the plurality of double blade drills 10 set therein was rotated clockwise (in a direction of arrows in FIG. 8) to revolve the double blade drills 10.

In FIG. 8, the region 17 inside a dotted line represents a hollow cathode plasma-accumulated portion.

Each double blade drill 10 was thus subjected to de-coating and as a result, a sheath with a thickness of 5 to 30 mm was formed through plasma on a surface of the double blade drill 10, as illustrated in FIG. 7. Further, as illustrated in FIG. 7, shadow zones insufficiently exposed to hollow cathode plasma were formed, and a phenomenon in which the substrate is coated with substrate ingredients deposited by sputtering the substrate (expressed as re-deposition in FIG. 7) was seen.

Then, after the de-coating treatment, the surface of each double blade drill was observed with a scanning electron microscope (SEM). An SEM image observed at 25× is illustrated in FIG. 9(a) and an SEM image observed at 2,000× is illustrated in FIG. 9(b).

Figure 9:
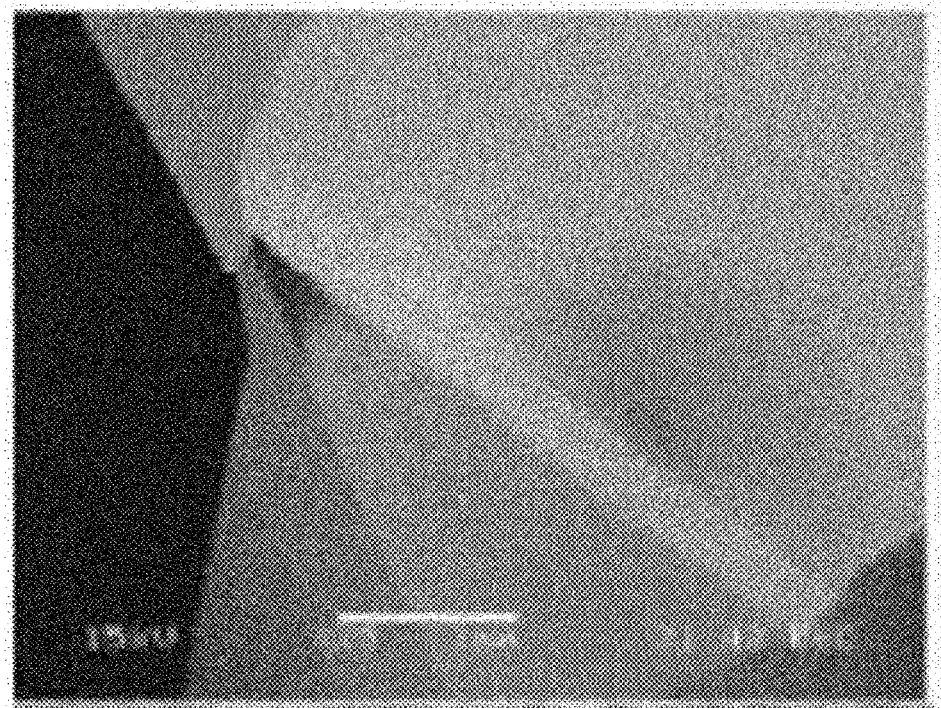
FIG. 9 are scanning electron micrographs (SEMs) after removal of a PCD coating.
Figure 9:
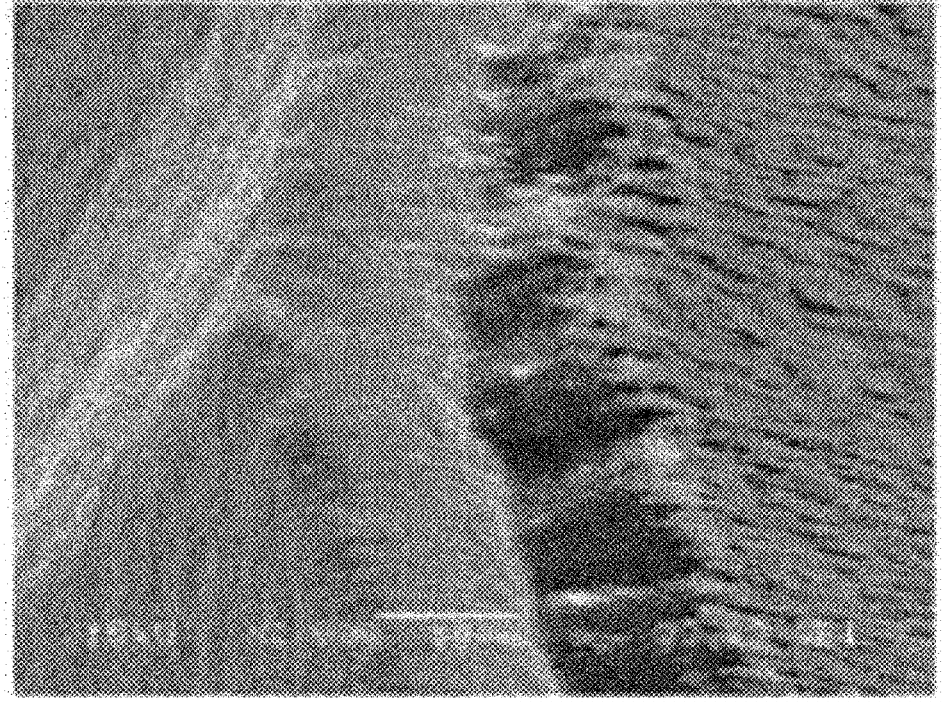

As illustrated in FIG. 9, PCD thin film residue was detected. Therefore, it is difficult to form a coating again unless the residue is mechanically removed.

The HC apparatus was also defective in that heat generation is large because of its structure, and the HC apparatus cannot withstand long hours of operation without using a water-cooling structure or a heat-resistant material.

Experimental Example 3

An ion irradiation apparatus was used and a bias voltage was added to subject the double blade drills 10 to de-coating as in Experimental Example 1.

Figure 10:
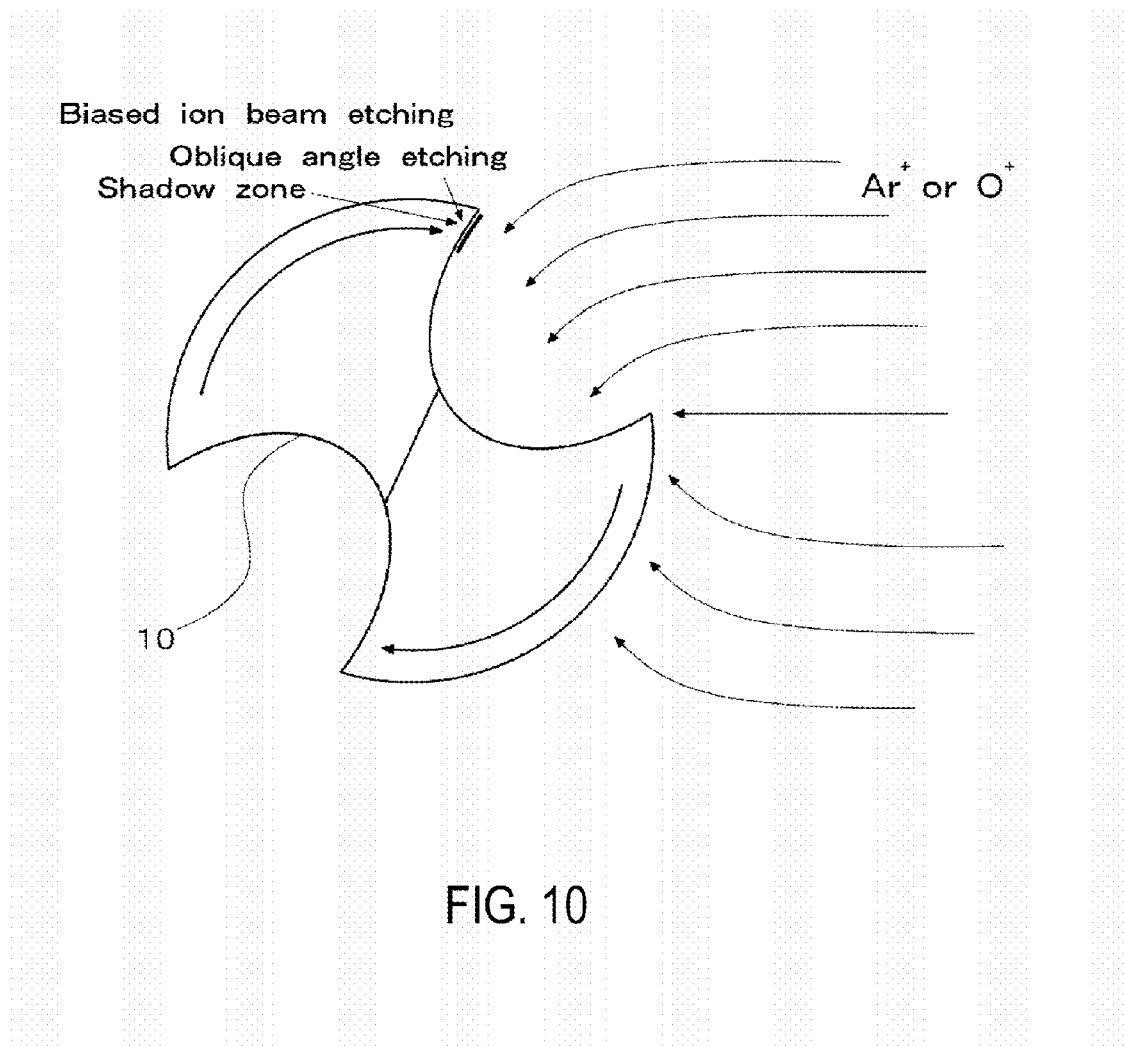
FIG. 10 is a cross-sectional view (schematic view) of a PCD-coated double blade drill when ion irradiation is performed through forced addition of a bias voltage.

A cross-sectional view (schematic view) of the double blade drill 10 during the de-coating treatment using the ion irradiation apparatus is illustrated in FIG. 10. Further, a cross-section of the ion irradiation apparatus when viewed from above and the layout of the double blade drills 10 are illustrated in FIG. 11.

Figure 11:
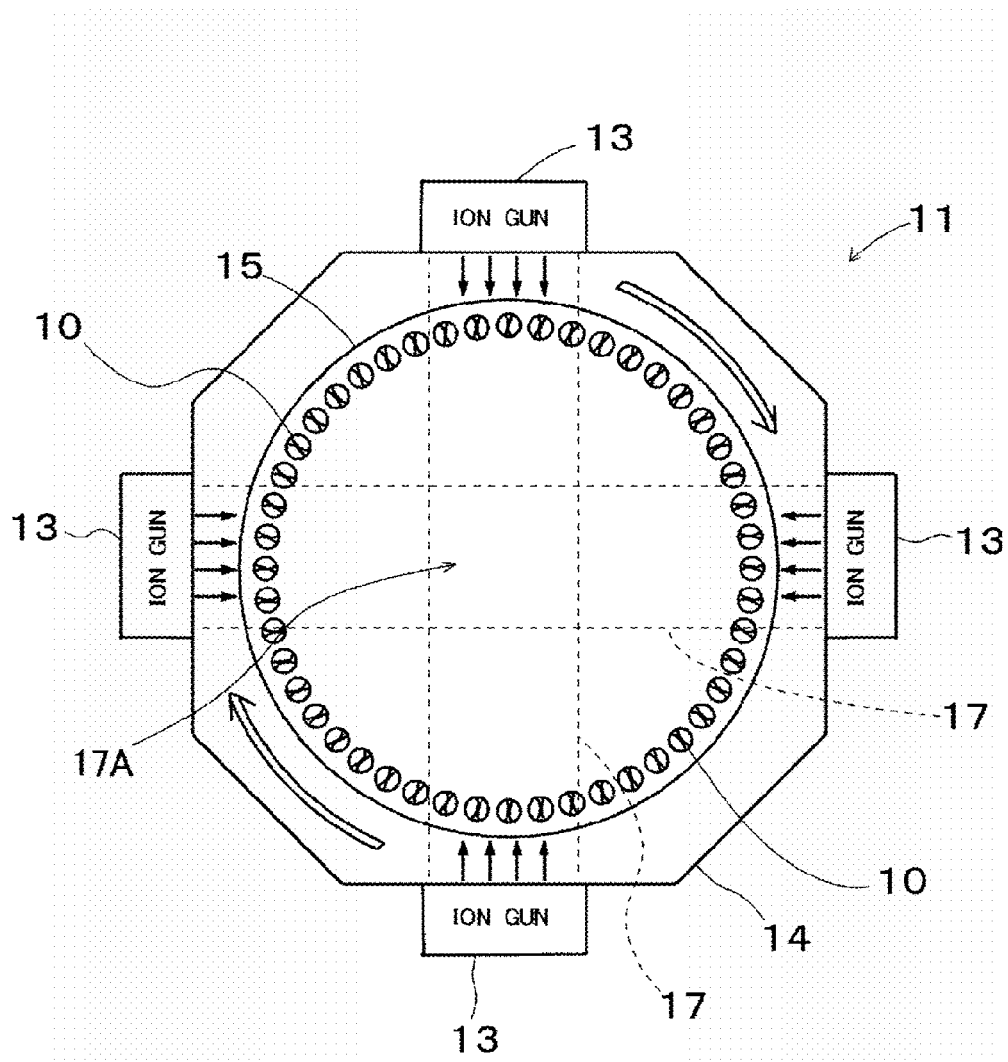
FIG. 11 is a cross-sectional view of an apparatus when viewed from above in the case of ion irradiation through forced addition of a bias voltage, and a schematic view illustrating the layout of tools (double blade drills).

The ion irradiation apparatus 11 illustrated in FIG. 11 includes four ion guns 13 and a vacuum chamber 14, and the holder 15 connected to a cathode is placed inside the vacuum chamber 14. Then, the plurality of double blade drills 10 are set in the holder 15. Further, as illustrated in FIG. 11, the four ion guns 13 are placed so that the two ion guns 13 face each other. Further, each of the ion guns 13 turns gases (argon+oxygen) introduced through a gas inlet into plasma to generate ions of the gas, and emits the ion flow 17 serving as an ion beam.

Commercially available CED ion guns (Closed Electron Drift Ion Guns) were used as such ion beam generating devices.

De-coating treatment conditions are shown in Table 3. The holder 15 was connected to the cathode and a bias voltage was added.

TABLE 3

| | |
|---|---|
| Vacuum pressure and remaining gas | P = 0.1 to 0.35 Pa, $O_2$, Ar |
| Bias voltage $U_{bias}$ V | −100 to −500 |
| Sheath phase thickness $D_{sheath}$ mm | 0 |
| Ionization current mA | 0.1 |
| Ionization voltage KV | 1 |

During the de-coating treatment, the double blade drills 10 were rotated clockwise (in a direction of arrows in FIG. 10). Further, during the de-coating treatment, as illustrated in FIG. 11, the holder 15 including the plurality of double blade drills 10 set therein was rotated clockwise (in a direction of arrows in FIG. 11) to revolve the double blade drills 10.

In FIG. 11, a central region where the two ion flows 17 overlap each other indicates a portion (ion flow-concentrated portion 17A) where emitted ions are accumulated.

Each double blade drill 10 was thus subjected to de-coating and as a result, a portion (shadow zone) insufficiently exposed to the emitted ions was formed, as illustrated in FIG. 10.

Then, after the de-coating treatment, the surface of each double blade drill was observed with a scanning electron microscope (SEM). An SEM image observed at 35× is illustrated in FIG. 12(a) and an SEM image observed at 1,000× is illustrated in FIG. 12(b).

Figure 12:
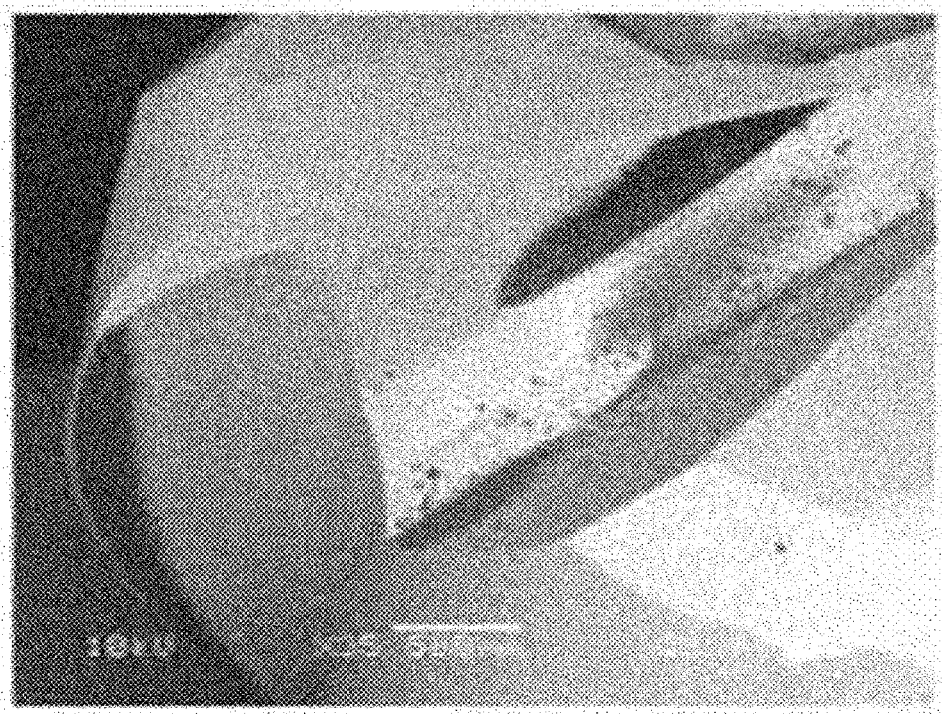
FIG. 12 are scanning electron micrographs (SEMs) of a tool (double blade drill) when a PCD coating is removed by ion irradiation through forced addition of a bias voltage.
Figure 12:
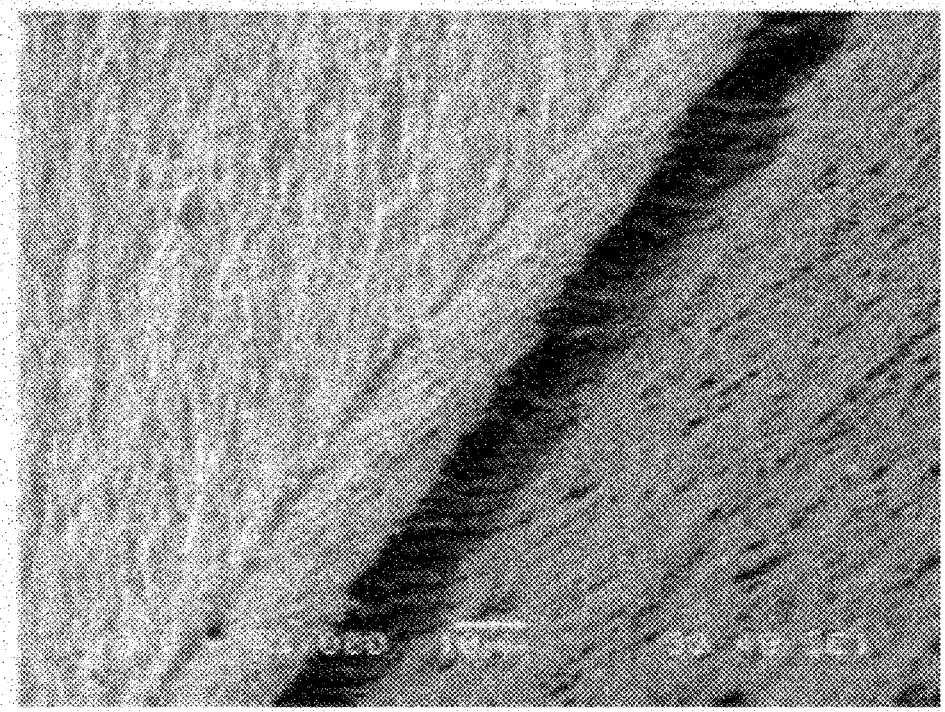

As illustrated in FIG. 12, PCD thin film residue was detected. Therefore, it is difficult to form a coating again unless the residue is mechanically removed.

Experimental Example 4

An ion irradiation apparatus was used to subject the double blade drills 10 to de-coating as in Experimental Example 1 without adding a bias voltage.

Figure 13:
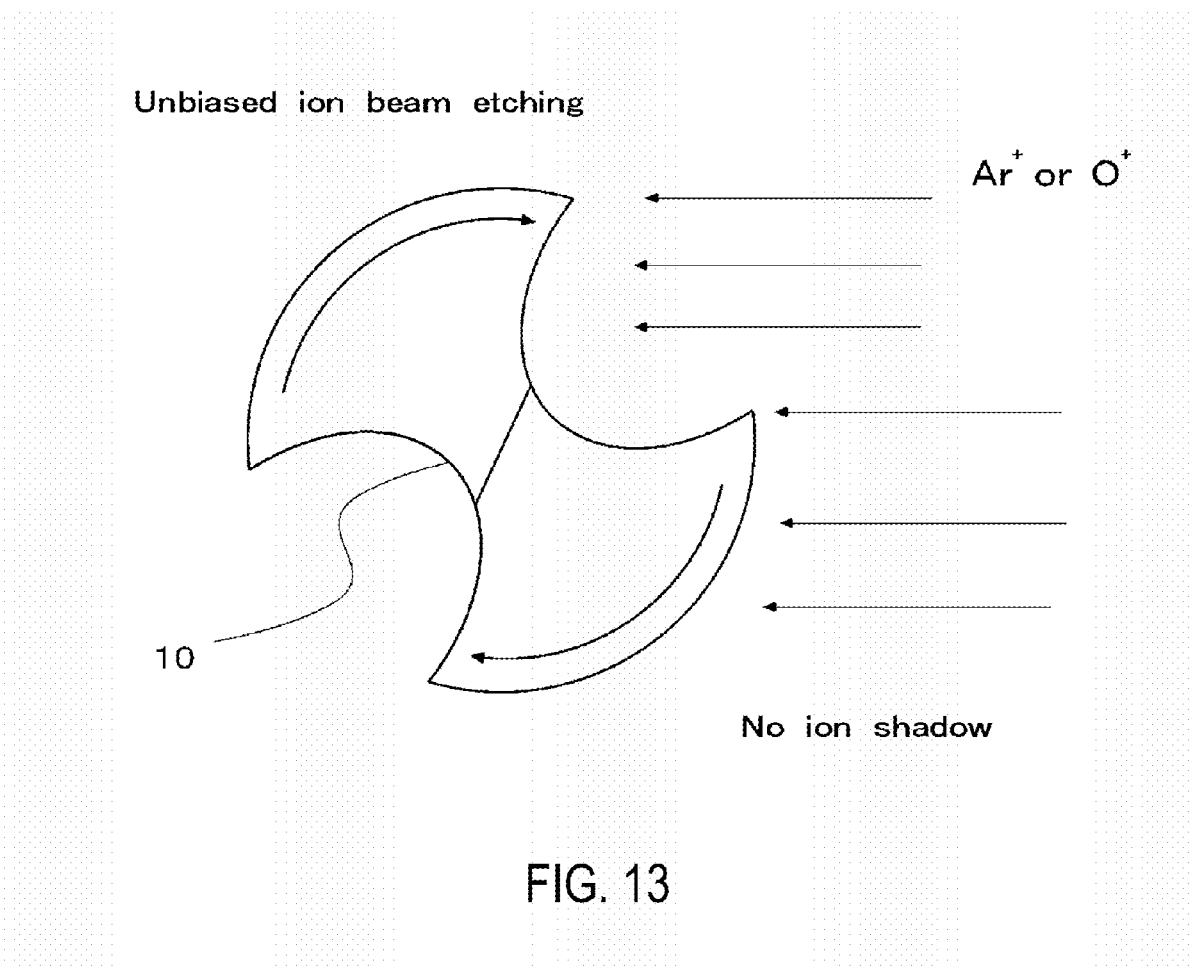
FIG. 13 is a cross-sectional view (schematic view) of a PCD-coated double blade drill when ion irradiation is performed under grounding without adding a bias voltage.

A cross-sectional view (schematic view) of the double blade drill 10 during the de-coating treatment using the ion irradiation apparatus under grounding without adding a bias voltage is illustrated in FIG. 13. Further, a cross-section of the ion irradiation apparatus when viewed from above and the layout of the double blade drills 10 are illustrated in FIG. 14.

Figure 14:
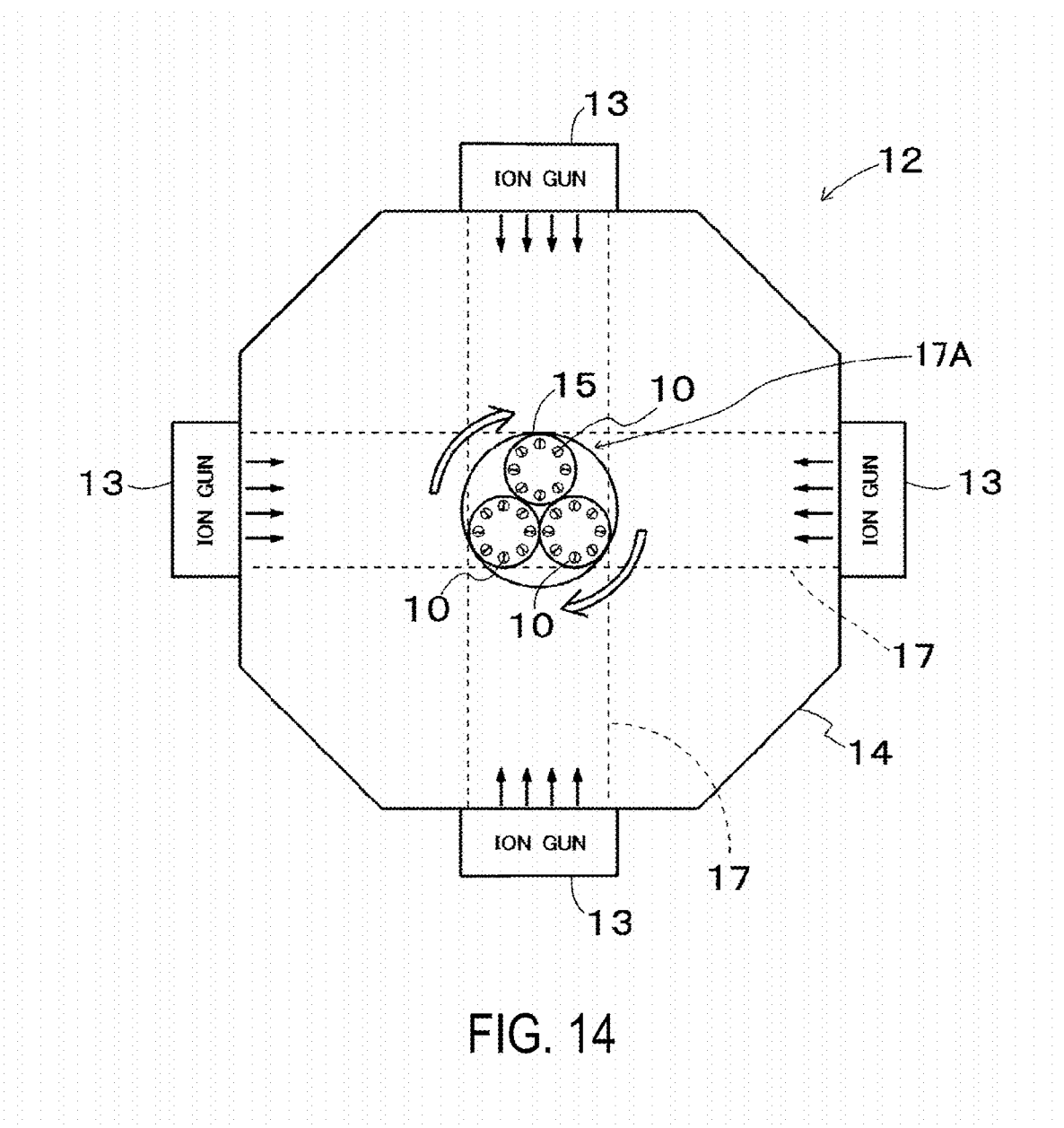
FIG. 14 is a cross-sectional view of an apparatus when viewed from above in the case of ion irradiation at an ion flow-concentrated portion under grounding without adding a bias voltage, and a schematic view illustrating the layout of tools.

As in the ion irradiation apparatus 11 used in Experimental Example 3, an ion irradiation apparatus 12 illustrated in FIG. 14 includes the four ion guns 13 and the vacuum chamber 14, and the holder 15 which is grounded is placed inside the vacuum chamber 14. Further, the holder 15 including the plurality of double blade drills 10 set therein is grounded at the central portion (ion flow-concentrated portion 17A) where emitted ions concentrate.

Further, as illustrated in FIG. 14, the four ion guns 13 are placed so that the two ion guns 13 face each other. Further, each of the ion guns 13 turns a gas introduced through a gas inlet into plasma to generate ions of the gas, and emits the ion flow 17 serving as an ion beam.

First, oxygen was only introduced through the gas inlets as the gas [1]. The vacuum pressure of oxygen with which the vacuum chamber was to be filled was set to 0.1 to 0.35 Pa. Then, oxygen was turned into plasma at an ionization current of 0.1 mA and an ionization voltage of 1 KV to generate oxygen ions and ion flows serving as ion beams were emitted.

After that, when the thickness of a remaining thin film reached a minimum value of 1 μm (in other words, when the thickness of the thinnest portion of the remaining thin film reached 1 μm), introduction of oxygen was stopped and argon serving as the gas [2] was introduced through the gas inlets. The vacuum pressure of argon with which the vacuum chamber was to be filled was set to 0.1 to 0.35 Pa. Then, argon was turned into plasma at an ionization current of 0.1 mA and an ionization voltage of 1 KV to generate argon ions and ion flows serving as ion beams were emitted.

De-coating treatment conditions are shown in Table 4.

TABLE 4

| | |
|---|---|
| Vacuum pressure | P = 0.1 to 0.35 Pa |
| Bias voltage $U_{bias}$ V | Grounded |
| Sheath phase thickness $D_{sheath}$ mm | 0 |
| Ionization current mA | 0.1 |
| Ionization voltage KV | 1 |

During the de-coating treatment, each double blade drill 10 was rotated (on its axis) clockwise (in a direction of arrows in FIG. 13). Further, during the de-coating treatment, as illustrated in FIG. 14, the holder 15 including the plurality of double blade drills 10 set therein was rotated clockwise (in a direction of arrows in FIG. 14) to revolve the double blade drills 10.

In FIG. 14, a central region where the two ion flows 17 overlap each other indicates a portion (ion flow-concentrated portion 17A) where emitted ions are accumulated.

Each double blade drill 10 was thus subjected to de-coating and as a result, there was no deflection of the ion flows, and a portion (shadow zone) such as the ones observed in Experimental Examples 2 and 3 which were not sufficiently exposed to the emitted ion flows was not formed.

Then, after the de-coating treatment, the surface of each double blade drill was observed with a scanning electron microscope (SEM). An SEM image observed at 25× is illustrated in FIG. 15(a) and an SEM image observed at 2,000× is illustrated in FIG. 15(b).

Figure 15:
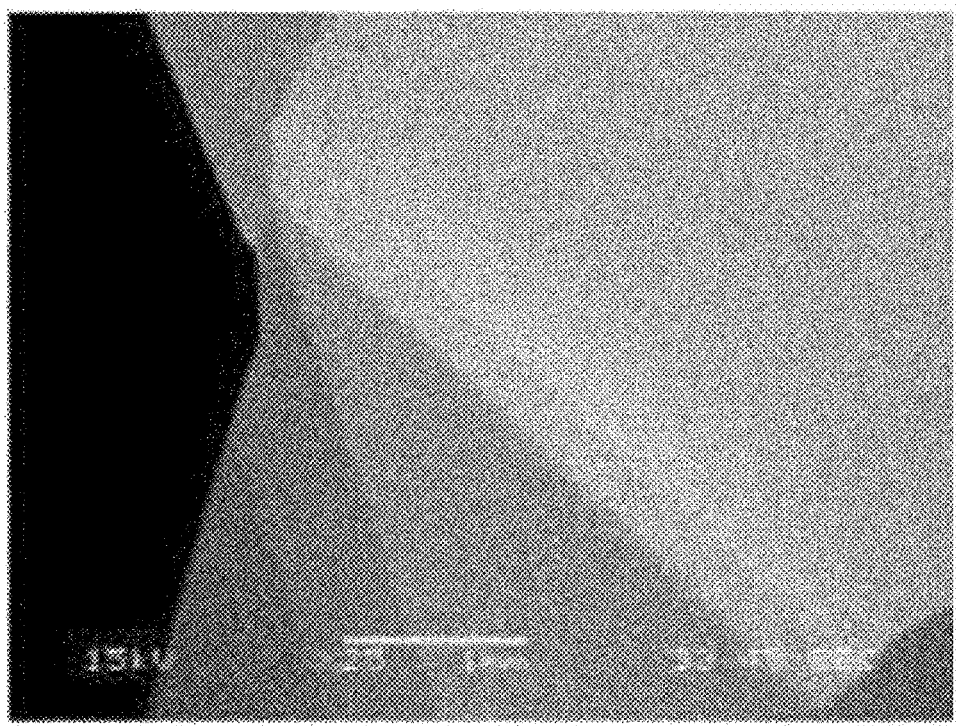
FIG. 15 are scanning electron micrographs (SEMs) of a tool (double blade drill) in the case of ion irradiation at the ion flow-concentrated portion under grounding without adding a bias voltage.
Figure 15:
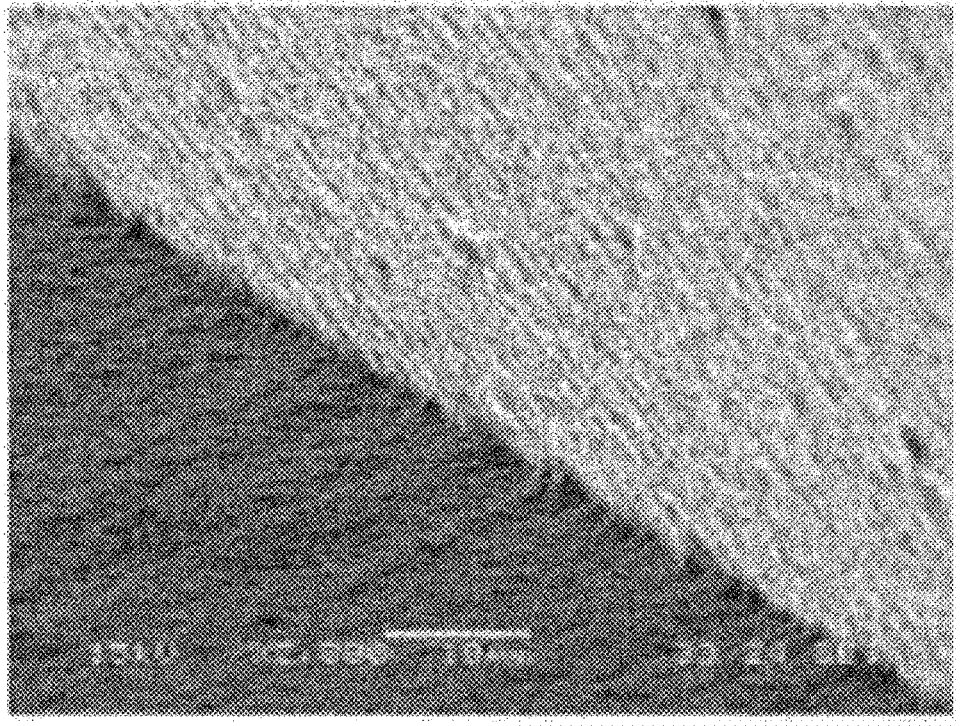

As illustrated in FIG. 15, a PCD coating with a thickness of 10 μm could be removed. Further, the surface of the substrate was not roughened. Therefore, it is possible to form a coating again.

Experimental Example 5

The same ion irradiation apparatus as used in Experimental Example 4 was used to perform the same experiment except that the ionization current and the ionization voltage were set to 120 mA and 4 KV, respectively, when oxygen serving as the gas [1] and argon serving as the gas [2] were turned into plasma.

Then, after the de-coating treatment, a cutting face of each double blade drill was observed with a scanning electron microscope (SEM). The cutting face is also commonly called a dead area and is a portion where de-coating is difficult. An SEM image observed at 600× is illustrated in FIG. 16(a) and an SEM image observed at 3,000× is illustrated in FIG. 16(b).

Figure 16:
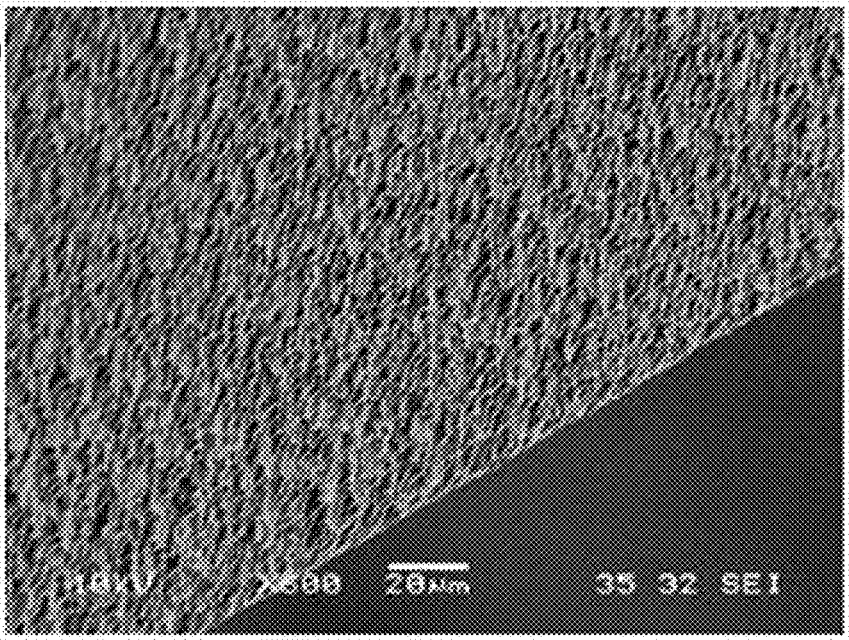
FIG. 16 are scanning electron micrographs (SEMs) of another tool (double blade drill) in the case of ion irradiation at an ion flow-concentrated portion under grounding without adding a bias voltage.
Figure 16:
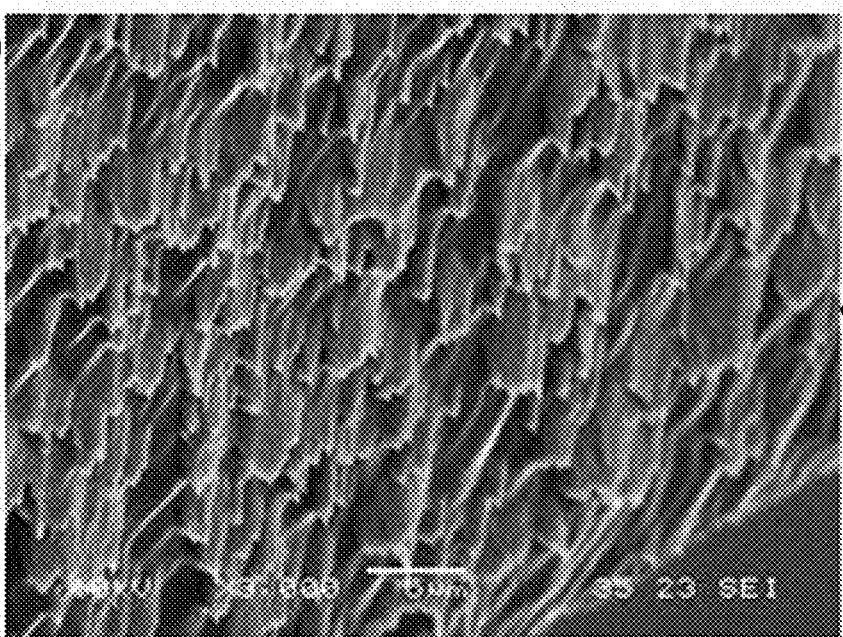

It was understood from FIG. 16 that a PCD coating could be substantially peeled off but a part of PCD once peeled off was vapor-deposited again. When such a phenomenon occurs, it is difficult to have de-coating further proceed.

Experimental Example 6

The same ion irradiation apparatus as used in Experimental Example 4 and Experimental Example 5 was used to perform the same experiment except that not only oxygen but also a gas containing 95 vol % of oxygen and 5 vol % of $CF_4$ was used as the gas [1]. Further, the ionization current and the ionization voltage were set to 120 mA and 4 KV, respectively, when (oxygen+$CF_4$) serving as the gas [1] and argon serving as the gas [2] were turned into plasma.

Then, after the de-coating treatment, a cutting face of each double blade drill was observed with a scanning electron microscope (SEM). The cutting face is also commonly called a dead area and is a portion where de-coating is difficult. An SEM image observed at 600× is illustrated in FIG. 17(a) and an SEM image observed at 3,000× is illustrated in FIG. 17(b).

Figure 17:
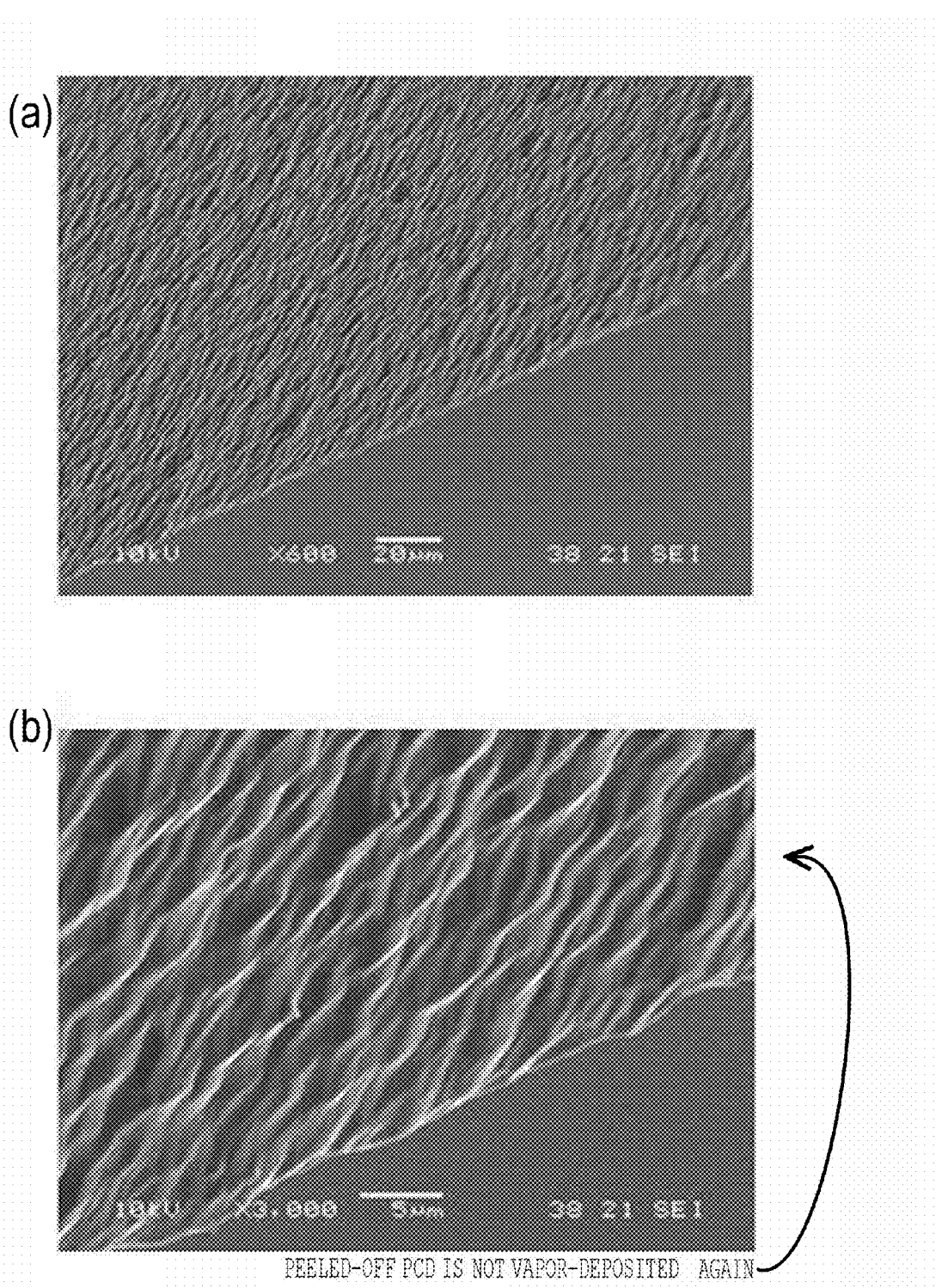
FIG. 17 are scanning electron micrographs (SEMs) of still another tool (double blade drill) in the case of ion irradiation at an ion flow-concentrated portion under grounding without adding a bias voltage.

According to FIG. 17, a PCD coating was peeled off, and a state obtained in Experimental Example 5 in which the peeled-off PCD was vapor-deposited again as observed in FIG. 16 was not observed. Therefore, de-coating is considered to proceed favorably.

Experimental Example 7

The $CF_4$ content in the gas [1] was set to 5 vol % in Experimental Example 6 but a plurality of experiments were performed in cases where this ratio was changed. The relation of the ratio to the PCD etching rate and the etching rate of the substrate was determined.

The other de-coating conditions were the same as in Experimental Example 6.

Figure 18:
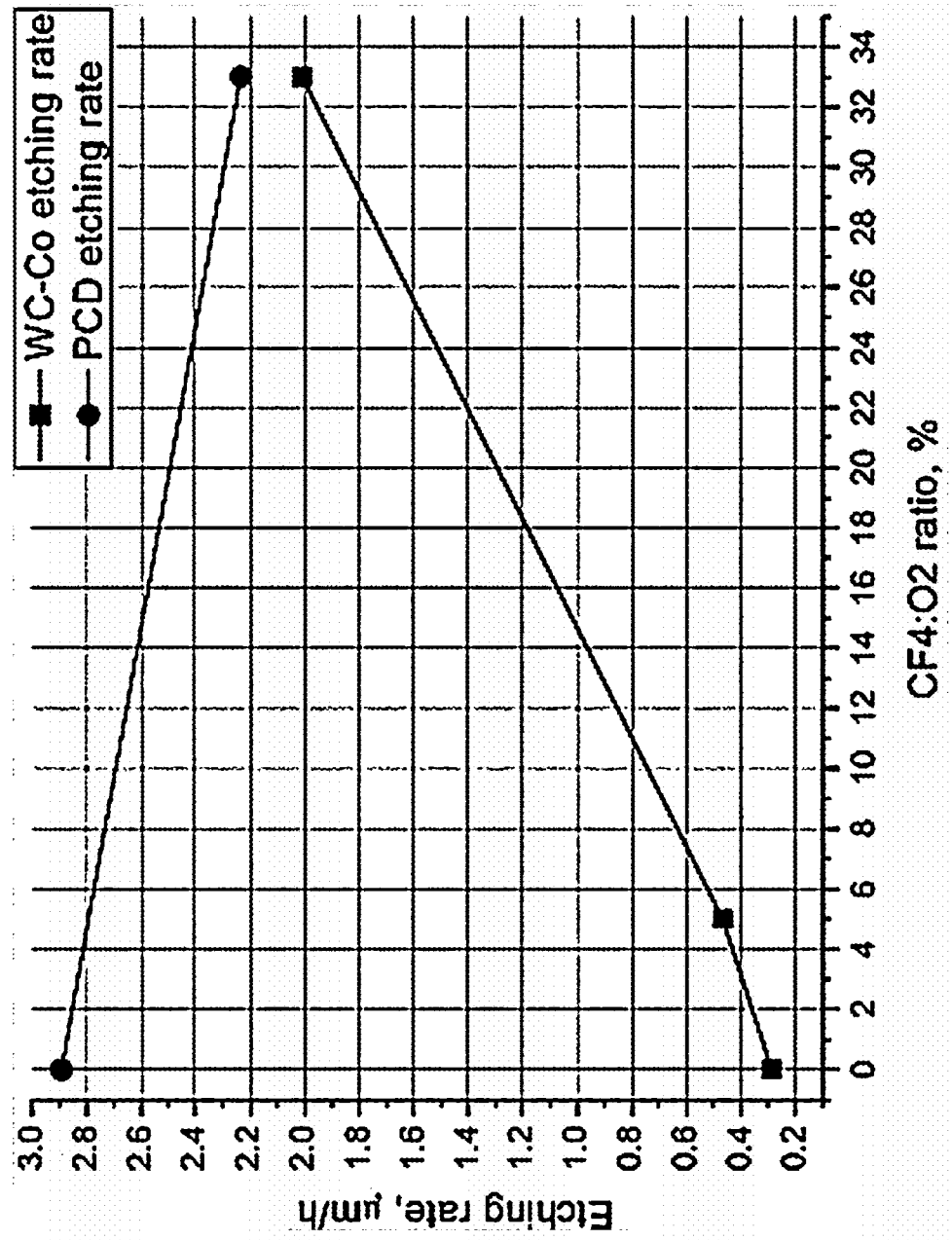
FIG. 18 is a graph illustrating the etching rate of PCD and that of the substrate when the $CF_4$ concentration in the gas is changed in the case of ion irradiation at an ion flow-concentrated portion under grounding without adding a bias voltage.

The results are shown in FIG. 18.

As illustrated in FIG. 18, with increasing $CF_4$, the PCD de-coating rate decreases while the etching rate of the substrate (denoted by WC—Co in FIG. 18) increases. When the substrate is etched to an excessive degree, recycling after the de-coating treatment is made difficult. Therefore, it can be determined from FIG. 18 that the ratio (referred to as CF4:O2 ratio in FIG. 18) of the $CF_4$ content (vol %) to the total of the $CF_4$ content (vol %) and the oxygen content (vol %) is reasonably 5% or less.

DESCRIPTION OF SYMBOLS

1: coated body
2: apparatus of the invention
3: ion gun
4: vacuum chamber
5: holder
7: ion flow
10: double blade drill
11: ion irradiation apparatus
12: ion irradiation apparatus
13: ion gun
14: vacuum chamber
15: holder
17: ion flow
17A: ion flow-concentrated portion

The invention claimed is:

1. A de-coating method comprising: placing a coated body in which a coating made of an inorganic material is formed on a surface of a metal body at an ion flow-concentrated portion where two or more ion flows overlap each other; grounding the coated body; and exposing the coated body to the ion flows to peel off the coating from the metal body, the de-coating method comprising:

a first step which includes turning a gas [1] containing at least 67 vol % of oxygen into plasma to generate ions of the gas and exposing the coated body to the resulting ion flows to perform de-coating, and a second step which includes turning a gas [2] containing at least 80 vol % of argon into plasma to generate ions of the gas and exposing the coated body to the resulting ion flows to perform de-coating, wherein the first step is followed by the second step.

2. The de-coating method according to claim 1, wherein the de-coating method comprises only the first step and the second step so that de-coating of the coated body can be completed by performing the second step serving as a final step.

3. The de-coating method according to claim 1, wherein the gas [1] contains at least one selected from the group consisting of argon, $CF_4$, $SF_6$, $CCl_4$, and $CCl_2F_2$.

4. The de-coating method according to claim 1, wherein the gas [1] contains $CF_4$, and a ratio of a $CF_4$ content (vol %) to a total of the $CF_4$ content (vol %) and an oxygen content (vol %) (($CF_4$ content/($CF_4$ content+oxygen content))×100) is 5% or less.

* * * * *